(12) United States Patent
Nakata et al.

(10) Patent No.: US 7,612,889 B2
(45) Date of Patent: Nov. 3, 2009

(54) METHOD AND APPARATUS FOR MEASURING DISPLACEMENT OF A SAMPLE

(75) Inventors: Toshihiko Nakata, Hiratsuka (JP); Masahiro Watanabe, Yokohama (JP); Shuichi Baba, Yokohama (JP); Yasuhiro Yoshitake, Yokohama (JP); Mineo Nomoto, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 253 days.

(21) Appl. No.: 11/188,732

(22) Filed: Jul. 26, 2005

(65) Prior Publication Data

US 2006/0215171 A1 Sep. 28, 2006

(30) Foreign Application Priority Data

Mar. 28, 2005 (JP) ............................. 2005-090460

(51) Int. Cl.
*G01B 9/02* (2006.01)
(52) U.S. Cl. ..................................................... 356/493
(58) Field of Classification Search .......... 356/484–495
See application file for complete search history.

(56) References Cited

U.S. PATENT DOCUMENTS

| 4,711,574 A | 12/1987 | Baldwin | |
|---|---|---|---|
| 4,784,490 A | 11/1988 | Wayne | |
| 4,912,530 A * | 3/1990 | Bessho | 356/487 |
| 5,166,751 A | 11/1992 | Massig | |
| 5,305,088 A * | 4/1994 | Hosoe | 356/487 |
| 5,305,089 A * | 4/1994 | Hosoe | 356/493 |
| 5,404,222 A * | 4/1995 | Lis | 356/487 |

FOREIGN PATENT DOCUMENTS

| EP | 0 281 385 | 9/1988 |
|---|---|---|
| EP | 0 469 718 | 2/1992 |
| JP | 63-228003 A | 9/1988 |
| JP | 04-282402 A | 10/1992 |
| JP | 2000-310507 A | 11/2000 |
| WO | WO 03/060422 A2 | 7/2003 |

OTHER PUBLICATIONS

Frank C. Demarest, "High-Resolution, High-Speed, Low Data Age Uncertainty, Heterodyne, Displacement Measuring Interferometer Electronics", 1998 IOP Publishing Ltd., pp. 1024-1030.

* cited by examiner

*Primary Examiner*—Hwa (Andrew) S Lee
(74) *Attorney, Agent, or Firm*—Antonelli, Terry, Stout & Kraus, LLP.

(57) ABSTRACT

In a displacement measurement apparatus using light interference, a probe light path is spatially separated from a reference light path. Therefore, when a temperature or refractive index distribution by a fluctuation of air or the like, or a mechanical vibration is generated, an optical path difference fluctuates between both of the optical paths, and a measurement error is generated. In the solution, an optical axis of probe light is brought close to that of reference light by a distance which is not influenced by any disturbance, a sample is irradiated with the probe light, a reference surface is irradiated with the reference light, reflected light beams are allowed to interfere with each other, and a displacement of the sample is obtained from the resultant interference light to thereby prevent the measurement error from being generated by the fluctuation of the optical path difference.

9 Claims, 7 Drawing Sheets

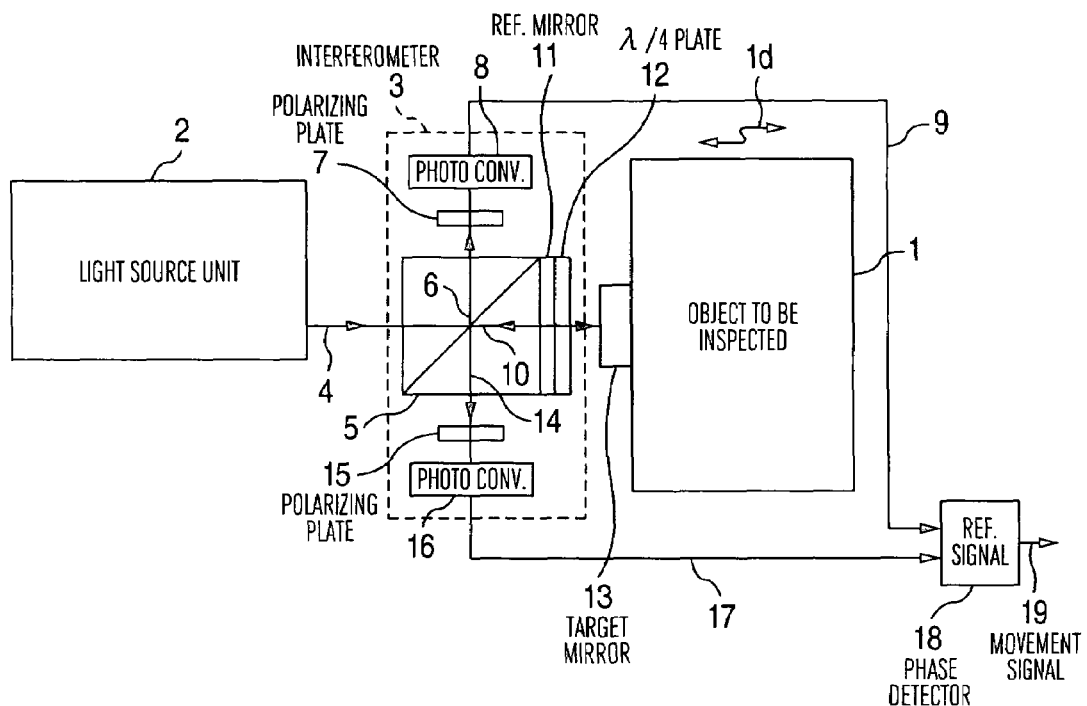
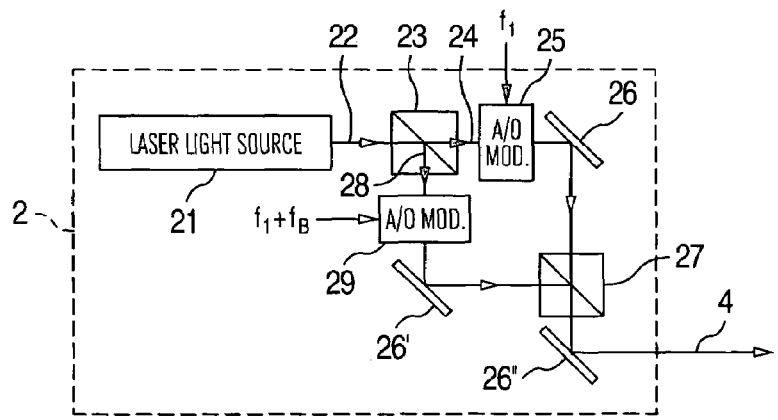
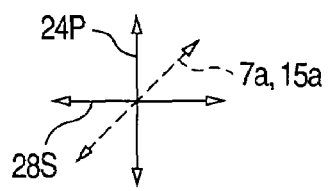

METHOD AND APPARATUS FOR MEASURING DISPLACEMENT OF A SAMPLE

INCORPORATION BY REFERENCE

The present application claims priority from Japanese application JP 2005-090460 filed on Mar. 28, 2005, the content of which is hereby incorporated by reference into this application.

BACKGROUND OF THE INVENTION

The present invention relates to a method and an apparatus for measuring a displacement of a sample by use of light interference, more particularly to a method and an apparatus for measuring a displacement in which a sample is irradiated with laser light, reflected light is allowed to interfere with reference light, and a displacement of the sample is measured from the resultant interference signal.

As a method for measuring a displacement or a movement of a sample, a method using light interference has been broadly known (Meas. Sci. Technol., 9 (1998), 1024 to 1030). One example is shown in FIG. 10.

In an interferometer shown in FIG. 10, a laser head 301 emits double-frequency orthogonally polarized light beams 302 whose polarization directions cross each other at right angles and whose optical frequencies are different from each other by 20 MHz. The light beams are split into two polarized components by a polarization beam splitter 303. After an S-polarized light beam 303' is reflected by the polarization beam splitter 303, the light beam is reflected by a right angle prism 304, and enters the polarization beam splitter 303 as reference light. A P-polarized light beam 305 passes through the polarized light beam splitter 303. The light beam is reflected by a right angle prism 306 placed on a sample to be measured 400, and enters the polarization beam splitter 303. Both of the reflected light beams are combined in the polarization beam splitter 303, and pass through a polarizing plate 307 having a polarizing angle of 45° with respect to polarization directions of both of the reflected light beams to cause heterodyne interference.

This heterodyne interference light is received by a photoelectric conversion element 308, and is converted into an electric signal 309. Doppler shift frequency is added to a frequency $f_M$ of the heterodyne interference signal 309 in accordance with a moving velocity V of the measurement sample 400, and the frequency $f_M$ is given by Equation 1:

$$f_M = f_B \pm NV/\lambda \qquad (1),$$

where $f_B$=20 MHz, λ denotes a wavelength of laser light, and N=2, 4, . . . which denotes a constant determined by the number of times the light travels both ways in an optical path. In FIG. 10, N=2. On the other hand, a beat signal 310 indicating $f_B$=20 MHz is output as a reference signal from the laser head 301.

The measured heterodyne interference signal 309 and reference signal 310 are input into a phase detection circuit 311, the moving velocity V and a movement 400d of the measurement sample 400 are obtained from a phase difference between both of the signals, and a movement output signal 312 is output.

In the interferometer shown in FIG. 10, a probe optical path, that is, an optical path through which the P-polarized light beam 305 as probe light passes is spatially separated from a reference optical path through which the S-polarized light beam 303 as the reference light passes. Therefore, when a temperature or refractive index distribution is made by a fluctuation of air or the like, or a mechanical vibration is generated, an optical path difference varies between both of the optical paths, and this generates a measurement error of a nanometer order. A positioning precision of the order of a sub-nanometer or less is required in an exposure device for manufacturing a semiconductor fine pattern for a 45 nm or 32 nm node in future, a stage of a pattern dimension measurement apparatus, or a probe microscope for use in local characterization. The conventional technique shown in FIG. 10 cannot meet the requirement. There is supposed a method of controlling environment factors such as temperature, humidity, and mechanical vibration with a high precision, but economical effects remarkably drop with regard to apparatus costs and sizes, and conveniences.

SUMMARY OF THE INVENTION

An object of the present invention is to provide a method and an apparatus for measuring displacement in which a displacement or a movement of a sample can be stably measured.

In the present invention, a light beam from a light source is split into first and second light beams, an optical axis of the first light beam is brought close to that of the second light beam to irradiate a movable sample with the first light beam, and a reference surface is irradiated with the second light beam. Accordingly, when the reflected light beam from the sample is allowed to interfere with the reflected light beam from the reference surface, and a movement of the sample is obtained from interference light, the movement of the sample can be obtained with a high precision without being influenced by any disturbance.

Moreover, in the present invention, when the optical axis of the first light beam is brought close to that of the second light beam, a distance is set such that changes of physical properties of a medium around the optical axes of the first and second light beams equally act on the optical axes of the first and second light beams. Accordingly, influences of the disturbances equally act on two light beams, and are offset, and it is possible to obtain the movement of the sample with the high precision without being influenced by any disturbance.

Furthermore, in the present invention, when the optical axis of the first light beam is brought close to that of the second light beam, the optical axis of the first light beam is matched with that of the second light beam. Accordingly, the influences of the disturbances equally act on two light beams, and are offset, and it is possible to obtain the movement of the sample with the high precision without being influenced by any disturbance.

Additionally, in the present invention, the reference surface comprises a diffraction grating. Accordingly, the optical axis of the first light beam can be matched with that of the second light beam. The influences of the disturbances equally act on two light beams, and are offset, and it is possible to obtain the movement of the sample with the high precision without being influenced by any disturbance.

Moreover, according to the present invention, a light beam from a light source is split into first and second light beams, an optical axis of the first light beam is brought close to that of the second light beam to irradiate the surface of a sample with the first light beam, and a reference surface is irradiated with the second light beam. Accordingly, when the reflected light beam from the surface of the sample is allowed to interfere with the reflected light beam from the reference surface, and a shape of the surface of the sample is obtained from interference light, the surface shape of the sample can be obtained with a high precision without being influenced by any disturbance.

According to the present invention, the influences of the disturbances, for example, a temperature or a refractive index distribution by a fluctuation of air or the like, or a mechanical vibration, equally act on probe light (first light beam) and reference light (second light beam). Therefore, when two light beams interfere with each other, the influences of the disturbances can be offset. As a result, it is possible to obtain the displacement or the movement of the sample from the interference light with a precision of the order of a sub-nanometer or less without being influenced by the disturbances like the air fluctuation and the mechanical vibration.

Moreover, when the above-described common optical path type interferometer is constituted, a displacement measurement apparatus can be miniaturized. Therefore, the present apparatus is applicable even in a case where a space around the measurement sample is small.

Furthermore, since it is not necessary to control environmental factors such as temperature, humidity, and mechanical vibration, there are produced effects that economical effects are remarkably enhanced with regard to apparatus costs and sizes, and conveniences.

These and other objects, features and advantages of the invention will be apparent from the following more particular description of embodiments of the invention, as illustrated in the accompanying drawings.

BRIEF DESCRIPTION OF THE DRAWINGS

FIG. 1A is a diagram showing a schematic constitution of a displacement measurement apparatus in Embodiment 1 of the present invention, FIG. 1B is a diagram showing a constitution of a light source unit, and FIG. 1C is a diagram showing double-frequency orthogonally polarized light beams, and a polarization direction of a polarizing plate;

DESCRIPTION OF THE EMBODIMENTS

Figure 2:
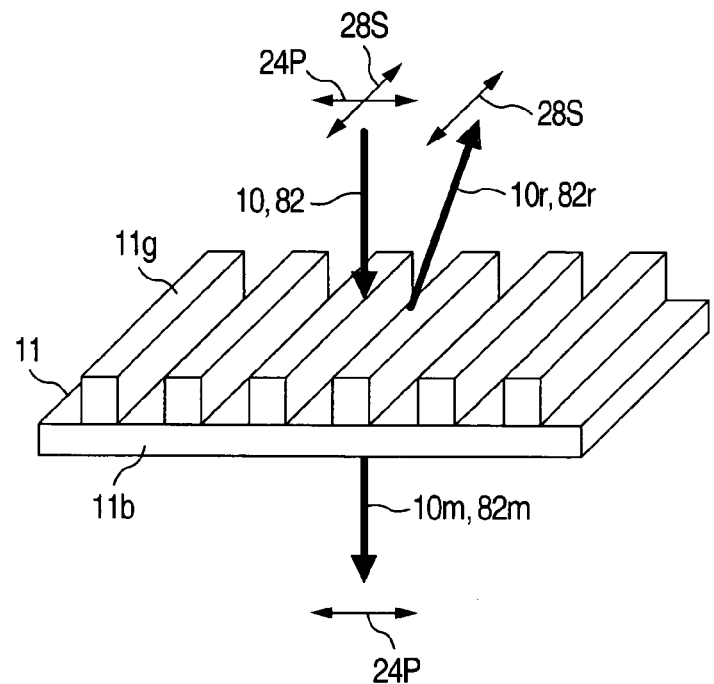
FIG. 2 is a schematic diagram showing a constitution of a reference mirror in the present invention.

Embodiments of the present invention will be described with reference to the drawings.

Embodiment 1

A first embodiment of the present invention will be described with reference to FIG. 1. As shown in FIG. 1A, a displacement measurement apparatus of the present embodiment is constituted of a light source unit 2, an interferometer unit 3, and a phase detection unit 18. As shown in FIG. 1B, in the light source unit 2, a linearly polarized light beam 22 from a linearly polarized laser light source 21 (e.g., a frequency-stabilized He—Ne laser having a wavelength of 632.8 nm) is allowed to enter a polarization beam splitter 23 in a polarization direction of 45°, and the light beam is split into two polarization components. A P-polarized light beam 24 passes through the polarization beam splitter 23, and an optical frequency shifts by a frequency $f_1$ by an acousto-optic modulator (AOM) 25 driven by the frequency $f_1$.

On the other hand, an S-polarized light beam 28 is reflected by the polarization beam splitter 23, and the optical frequency shifts by a frequency $f_1+f_B$ by an acousto-optic modulator 29 driven by the frequency $f_1+f_B$. Here, $f_B$ is, for example, in a range of 100 kHz to several tens of MHz. After the P-polarized light beam 24 and the S-polarized light beam 28 are reflected by mirrors 26 and 26', respectively, the light beams are synthesized by a polarization beam splitter 27, and is reflected by a mirror 26", so that a double-frequency orthogonally polarized light beam 4 is emitted from the light source unit 2. In FIG. 1C, as to the double-frequency orthogonally polarized light beam 4, reference numeral 24P denotes a polarization direction of the P-polarized light beam 24, and 28S denotes a polarization direction of the S-polarized light beam 28.

The double-frequency orthogonally polarized light beam 4 enters the interferometer unit 3, and is split into two optical paths by a non-polarization beam splitter 5. A double-frequency orthogonally polarized light beam 6 reflected by the non-polarization beam splitter 5 passes through a polarizing plate 7 having a polarizing angle in a direction of 45° with respect to both polarization directions as shown by a broken line 7a of FIG. 1C to thereby cause heterodyne interference. This heterodyne interference light is received by a photoelectric conversion element 8 such as a photodiode, is converted into an electric signal 9 of a beat frequency $f_B$, and is used as reference light. On the other hand, a double-frequency orthogonally polarized light beam 10 passed through the non-polarization beam splitter 5 enters a reference mirror 11. In the reference mirror 11, as shown in FIG. 2, a diffraction grating 11g is made of a metal material such as Al on a composite quartz substrate 11b.

In this diffraction grating, as shown in FIG. 2, in the double-frequency orthogonally polarized light beam 10, an S-polarized component 28S parallel to a longitudinal direction of the diffraction grating is reflected, and an orthogonally P-polarized component 24P passes as such. These are properties of a wire grid polarizer. In the present embodiment, the diffraction grating 11g has a pitch of 144 nm, a linear width of 65 nm, and a height of 165 nm. An S-polarized light beam 10r reflected by the reference mirror 11 is used as the reference light. A transmitted P-polarized light beam 10m is used as probe light.

After passing through a ¼ wavelength plate 12, the P-polarized light beam 10m forms a circularly polarized light beam, and is reflected by a target mirror 13 laid on a measurement sample 1 as an object to be inspected. After passing through the ¼ wavelength plate 12 again, the light beam forms an S-polarized light beam, and is reflected by the reference mirror 11. After passing through the ¼ wavelength plate 12, the light beam is reflected as a circularly polarized light beam by the target mirror 13. After passing through the ¼ wavelength plate 12, the light beam passes as a P-polarized light beam through the reference mirror 11. That is, the probe light 10m reciprocates twice through an optical path between the reference mirror 11 and the target mirror 13, and a movement 1d of the measurement sample 1 is enlarged twice and detected.

The S-polarized light beam 10r reflected by the reference mirror 11, and the transmitted P-polarized light beam 10m are reflected as a double-frequency orthogonally polarized light beam 14 by the non-polarization beam splitter 5. The double-frequency orthogonally polarized light beam 14 passes through a polarizing plate 15 having a polarizing angle in a direction of 45° with respect to both of the polarization directions as shown by a broken line 15a in FIG. 1C to thereby cause the heterodyne interference. This heterodyne interference light is received by a photoelectric conversion element 16 such as a photodiode, and is converted into an electric signal 17. Doppler shift frequency is added to a frequency $f_M$ of the heterodyne interference signal 17 in accordance with a moving velocity V of the measurement sample 1, and the frequency $f_M$ is given by Equation 1.

In Equation 1, N=4. A measured heterodyne interference signal I(t)17, and the reference signal 9 obtained by the photoelectric conversion element 8 are input into the phase detection unit 18. The moving velocity V and the movement 1d of the measurement sample 1 are obtained from a phase difference between both signals, and a movement signal 19 is output. In the phase detection unit 18, for example, a lock-in amplifier or the like is usable. The heterodyne interference signal I(t)17 is given by Equation 2:

$$I(t)=I_m+I_r+2(I_m\cdot I_r)^{1/2}\cos(2\pi f_B t \pm 2\pi NVt/\lambda) \quad (2),$$

where $I_m$ denotes a detected intensity of the probe light, $I_r$ denotes a detected intensity of the reference light, n denotes a refractive index of air, and λ denotes a wavelength of the laser light 22. From the phase detection unit 18, a second term: ±2πNVt/λ of a cos component of Equation 2 is output as a phase signal. For example, when the phase signal is π/1800, the movement results in 1d=0.044 nm.

As apparent from FIG. 1, two light beams of the probe light 10m and the reference light 10r directed to the target mirror 13 are emitted from the light source unit 2, and enter the interferometer unit 3. The light beams pass through completely the same optical path until the light beams reach the reference mirror 11, further until the light beams from the reference mirror 11 are received by the photoelectric conversion element 16. That is, a common optical path type interferometer is constituted. Therefore, even if a temperature or refractive index distribution by a fluctuation of air or the like is made, or a mechanical vibration is generated in the optical path, these disturbances equally influence both of the light beams. Therefore, when the light beams interfere with each other, the influences of the disturbances are completely offset, and the interference light is not influenced by any disturbance. The probe light 10m only exists in the optical path between the reference mirror 11 and the target mirror 13. However, for example, a probe microscope or the like has a stroke of about several hundreds of microns at most. Therefore, a gap between the reference mirror 11 and the target mirror 13 can be set to 1 mm or less, and the influence of the disturbance in such micro gap can be ignored.

Moreover, in the light source unit 2 shown in FIG. 1B, two polarized light beams 24, 28 crossing each other at right angles pass through separate optical paths, and there is a possibility that the influences of the disturbances are superimposed between both of the optical paths. However, even if there are the influences of the disturbances, the influences equally act on both of the heterodyne interference light and the reference light. Therefore, when the phase difference between both of the light is detected in the phase detection unit 18, the influences are offset.

By the constitution of the interferometer of the present embodiment, the moving velocity V and the movement 1d of the measurement sample 1 can be measured stably with a precision of the order of a sub-nanometer to a picometer without controlling environmental factors such as temperature, humidity, and acoustic vibration with a high precision. In the present embodiment, by use of a metal diffraction grating (wire grid polarizer) as the reference mirror, the probe light is generated from one of the double-frequency orthogonally polarized light beams, and the reference light can be coaxially generated from the other polarized light beam. Accordingly, the common optical path type heterodyne interferometer can be constituted.

Embodiment 2

Figure 3A:
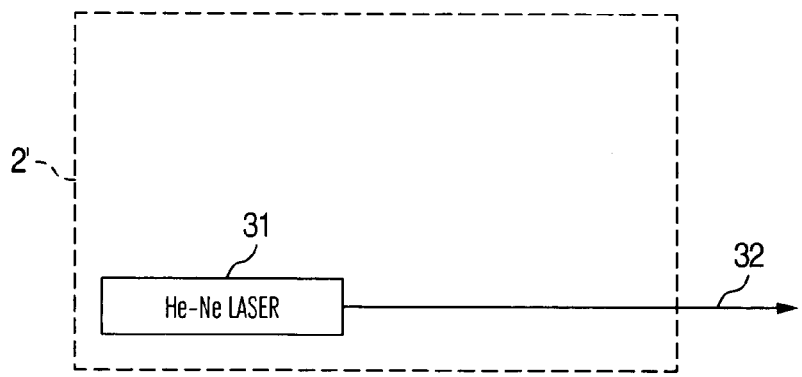
FIG. 3A is a constitution showing a constitution of a light source unit using a double-frequency He—Ne laser in Embodiment 2 of the present invention.
Figure 3B:
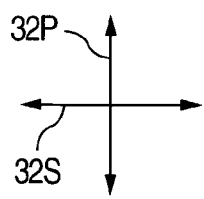
FIG. 3B is a diagram showing polarization directions of the double-frequency orthogonally polarized light beams.

In the first embodiment, as shown in FIG. 1B, two polarization beam splitters 23, 27 and two acousto-optic modulators 25, 29 are used in order to generate the double-frequency orthogonally polarized light beam 4. In a second embodiment, instead of the light source unit 2 shown in FIG. 1B in the first embodiment, as shown in FIG. 3A, a double-frequency He—Ne laser 31 (dual mode laser having vertical mode oscillation of two light beams) is used. The resultant double-frequency orthogonally polarized light beam 32 has polarization directions 32P, 32S as shown in FIG. 3B. As one example, a beat signal of about 640 MHz is obtained. Since constitutions and functions of an interferometer unit 3 and a phase detection unit 18 are similar to those of the first embodiment, description is omitted. According to the present embodiment, in the same manner as in the first embodiment, it is possible to measure a moving velocity V and a movement 1d of a measurement sample 1 stably with a precision of the order of a sub-nanometer to a picometer without controlling environmental factors such as temperature, humidity, and acoustic vibration with a high precision.

Embodiment 3

Figure 4:
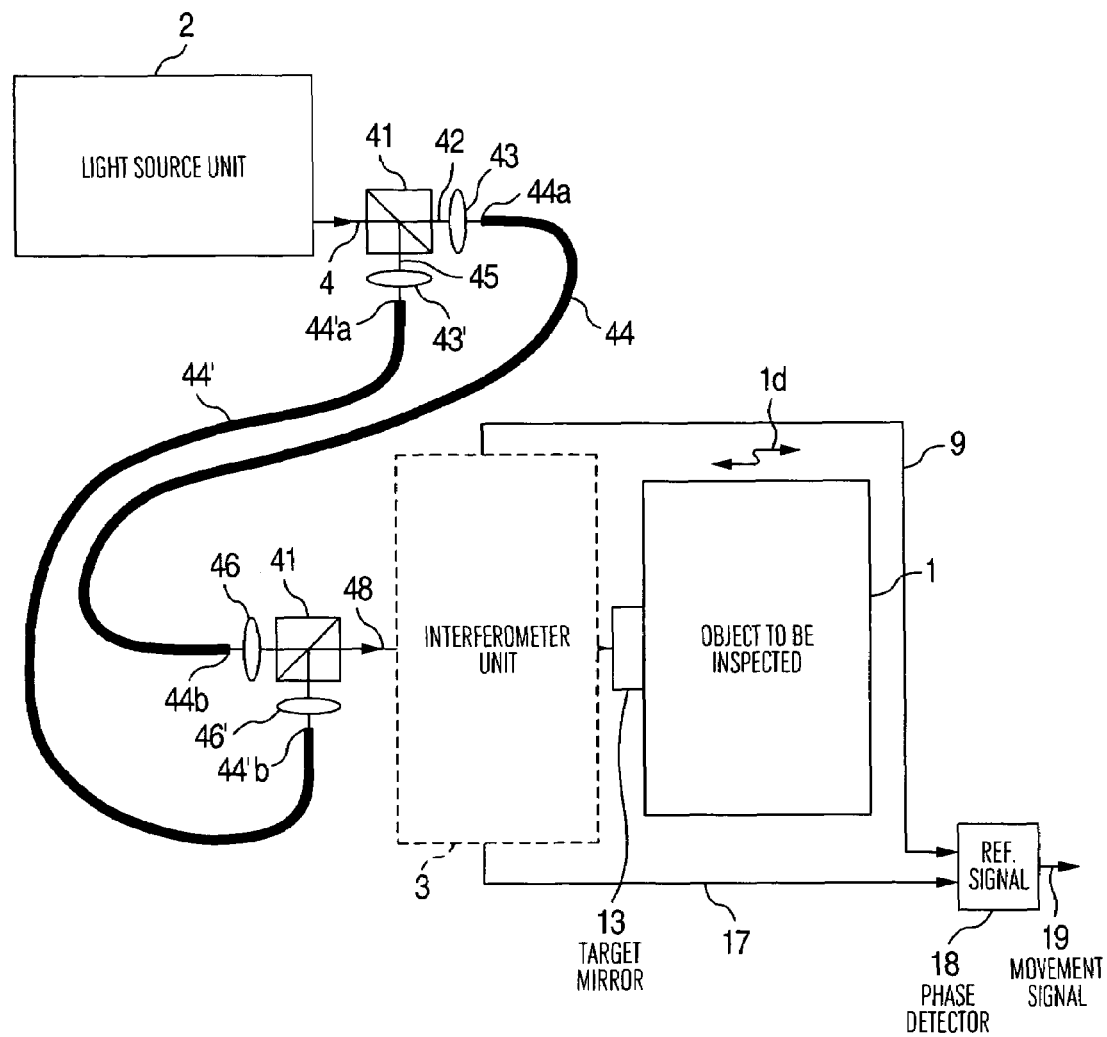
FIG. 4 is a schematic diagram showing an apparatus constitution of the displacement measurement apparatus which transmits the double-frequency orthogonally polarized light beams emitted from the light source unit by a polarization-reserving fiber in Embodiment 3 of the present invention.

Next, in a third embodiment of the present invention, a displacement measurement apparatus will be described with reference to FIG. 4. In the apparatus, double-frequency orthogonally polarized light beams 4, 32 emitted from a light source unit 2 are transmitted to an interferometer unit 3 by a polarization-reserving fiber. The double-frequency orthogonally polarized light beams 4, 32 are split into a P-polarized light beam 42 and an S-polarized light beam 45 by a polarization beam splitter 41. The P-polarized light beam 42 is condensed on an incidence end surface 44a of a polarization-reserving fiber 44 by a condensing lens 43, and transmitted while maintaining a linearly polarized light beam. The P-polarized light beam emitted from an emission end surface 44b of the polarization-reserving fiber 44 is formed into parallel light beams by a collimating lens 46, and the light beams pass through the polarization beam splitter 41. Similarly, the S-polarized light beam 45 is condensed onto an incidence end surface 44'a of a polarization-reserving fiber 44' by a condensing lens 43', and transmitted while maintaining a linearly polarized light beam.

The S-polarized light beam emitted from an emission end surface 44'b of the polarization-reserving fiber 44' is formed into parallel light beams by a collimating lens 46', and reflected by a polarization beam splitter 41. The P-polarized light beam and the S-polarized light beam are combined again into a double-frequency orthogonally polarized light beam 48, and enter the interferometer unit 3. Since constitutions and functions of the interferometer unit 3 and a phase detection unit 18 are similar to those of the first embodiment, description is omitted.

It is to be noted that in the present embodiment, a light source 2' described in the second embodiment may be used instead of the light source 2.

According to the present embodiment, in the same manner as in the first embodiment, it is possible to measure a moving velocity V and a movement 1d of a measurement sample 1 stably with a precision of the order of a sub-nanometer to a picometer without controlling environmental factors such as temperature, humidity, and acoustic vibration with a high precision. The light source unit 2 is separated from the interferometer unit 3, and is connected to the interferometer unit via the polarization-reserving fibers 44 and 44'. Accordingly, the light source unit is disposed far away, and the only interferometer unit 3 is disposed in the vicinity of the measurement sample 1. Therefore, there is an advantage that the apparatus is applicable even to a case where there is not any space in the vicinity of the measurement sample 1.

Embodiment 4

Next, in a fourth embodiment of the present invention, a method of generating reference light by use of a birefringent prism will be described with reference to FIG. 5. In a displacement measurement apparatus of the present embodiment, since basic constitutions and functions of a light source unit 2 and a phase detection unit 18 are similar to those of the first embodiment, description is omitted. Also in the present embodiment, a light source 2' described in the second embodiment may be used instead of the light source 2.

A method of generating reference light and an interferometer unit 503 only will be described hereinafter. In double-frequency orthogonally polarized light beams 10 transmitted through a non-polarization beam splitter 5, an optical axis of an S-polarized light beam 10br shifts in parallel by about 200 µm by a birefringent prism 50 constituted, for example, by laminating two optical materials 51 and 51' indicating birefringent characteristics. The light beam is reflected by a reflecting mirror 52 comprising a dielectric multilayered film, and returns as reference light along an original optical path. On the other hand, a P-polarized light beam 10bm passes as such through the birefringent prism 50, and is reflected as probe light by a target mirror 13. The light beam returns along the original optical axis, is combined with the reference light 10br, and is reflected as a double-frequency orthogonally polarized light beam 14 by the non-polarization beam splitter 5. In the same manner as in the first embodiment, as shown by a broken line 15a of FIG. 1C, the double-frequency orthogonally polarized light beam 14 passes through a polarizing plate 15 having a polarizing angle in a direction of 45° with respect to both polarization directions to cause heterodyne interference. This heterodyne interference light is received by a photoelectric conversion element 16, and is converted into an electric signal 57. Since subsequent operation an signal processing are similar to those of the first embodiment, description is omitted.

Figure 5:
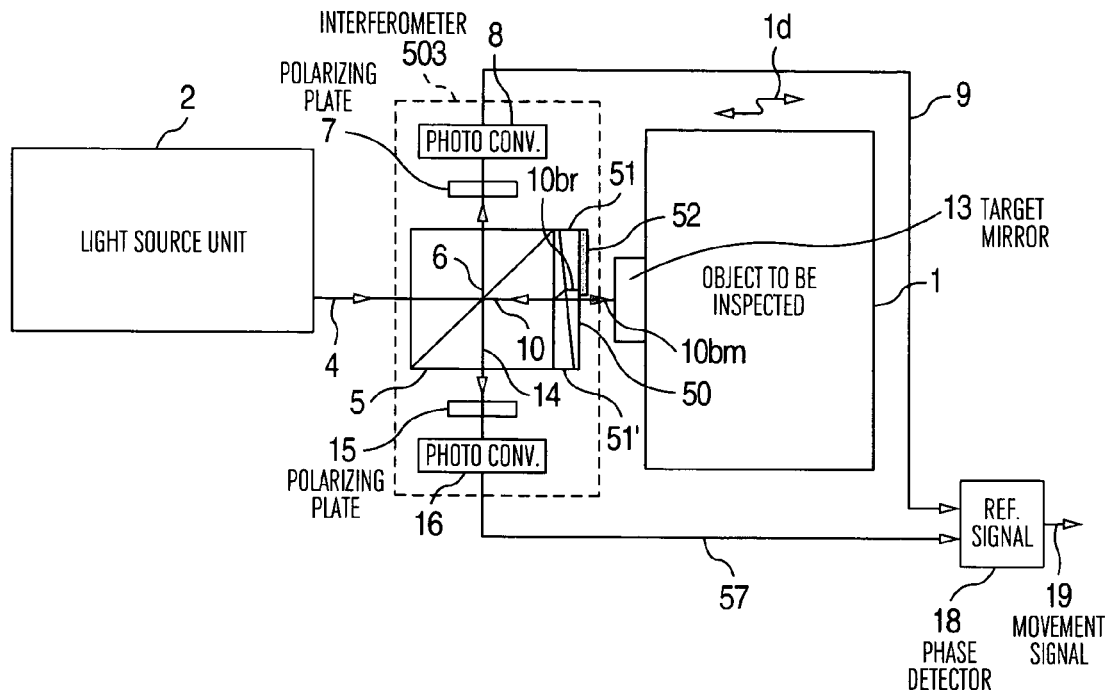
FIG. 5 is a schematic diagram showing an apparatus constitution of the displacement measurement apparatus which generates reference light by use of a birefringent prism in Embodiment 4 of the present invention.

As apparent from FIG. 5, two light beams of the probe light 10bm and the reference light 10br directed to the target mirror 13 are emitted from the light source unit 2, and enter the interferometer unit 503. The light beams pass through completely the same optical path until the light beams enter an incidence surface of the birefringent prism 50, and further until the light beams from the incidence surface of the birefringent prism 50 are received by the photoelectric conversion element 16. That is, a common optical path type interferometer is constituted. Therefore, even if a temperature or refractive index distribution by a fluctuation or the like of air, or a mechanical vibration is generated in the optical path, these disturbances equally influence both of the light beams. When the light beams interfere with each other, the influences of the disturbances are completely offset, and the interference light is not influenced by any disturbance. The probe light 10m only exists in the optical path between the incidence surface of the birefringent prism 50 and the target mirror 13. However, for example, a probe microscope or the like has a stroke of about several hundreds of microns at most. Therefore, a gap between the incidence surface of the birefringent prism 50 and the target mirror 13 can be set to several millimeters or less, and the influence of the disturbance in such micro gap can be ignored.

Therefore, according to the present embodiment, in the same manner as in the first embodiment, it is possible to measure a moving velocity V and a movement 1d of a measurement sample 1 stably with a precision of the order of a sub-nanometer to a picometer without controlling environmental factors such as temperature, humidity, and acoustic vibration with a high precision. In the present embodiment, by use of the birefringent prism 50 and the reflecting mirror 52, in the double-frequency orthogonally polarized light beams, probe light is generated from one polarized light beam, and reference light can be substantially coaxially generated from the other polarized light beam. Therefore, a common optical path type heterodyne interferometer can be constituted.

Embodiment 5

Next, in a fifth embodiment of the present invention, a method of generating reference light by use of a polarization beam splitter and a reflecting mirror will be described with reference to FIG. 6. In a displacement measurement apparatus of the present embodiment, since basic constitutions and functions of a light source unit 2 and a phase detection unit 18 are similar to those of the first embodiment, description is omitted. Moreover, in the present embodiment, a light source 2' described in the second embodiment may be used instead of the light source 2.

The method of generating the reference light and an interferometer unit 603 only will be described hereinafter. About 4% of a double-frequency orthogonally polarized light beam 4 emitted from the light source unit 2 is reflected by a light beam splitter 61 (transmittance of 96%, reflectance of 4%).

As shown by a broken line 7a of FIG. 1C, a reflected double-frequency orthogonally polarized light beam 62 passes through a polarizing plate 7 having a polarizing angle in a direction of 45° with respect to both polarization directions to cause heterodyne interference. This heterodyne interference light is received by a photoelectric conversion element 8, is converted into an electric signal 69 having a beat frequency $f_B$, and is used as a reference signal.

On the other hand, a double-frequency orthogonally polarized light beam 63 transmitted through the light beam splitter 61 is split into an S-polarized light beam 64 and a P-polarized light beam 65 by a polarization beam splitter 60. After passing through a ¼ wavelength plate 12', the S-polarized light beam 64 forms a circularly polarized light beam, and is reflected by a reflecting mirror 66 comprising a dielectric multilayered film. After passing through the ¼ wavelength plate 12' again, the light beam forms a P-polarized light beam, returns as reference light along an original optical axis, and passes through the polarization beam splitter 60.

After passing through a ¼ wavelength plate 12", the P-polarized light beam 65 forms a circularly polarized light beam, and is reflected as probe light by a target mirror 13. After passing through the ¼ wavelength plate 12" again, the light beam forms an S-polarized light beam, returns along the original optical axis, and is reflected by the polarization beam splitter 60. Two return light beams are combined to form a double-frequency orthogonally polarized light beam 67. In the same manner as in the first embodiment, as shown by a broken line 15a of FIG. 1C, the light beam passes through a polarizing plate 15 having a polarizing angle in a direction of 45° with respect to both polarization directions to perform heterodyne interference. This heterodyne interference light is received by a photoelectric conversion element 16, and is converted into an electric signal 68. Since subsequent operations and signal processing are similar to those of the first embodiment, description is omitted.

Figure 6:
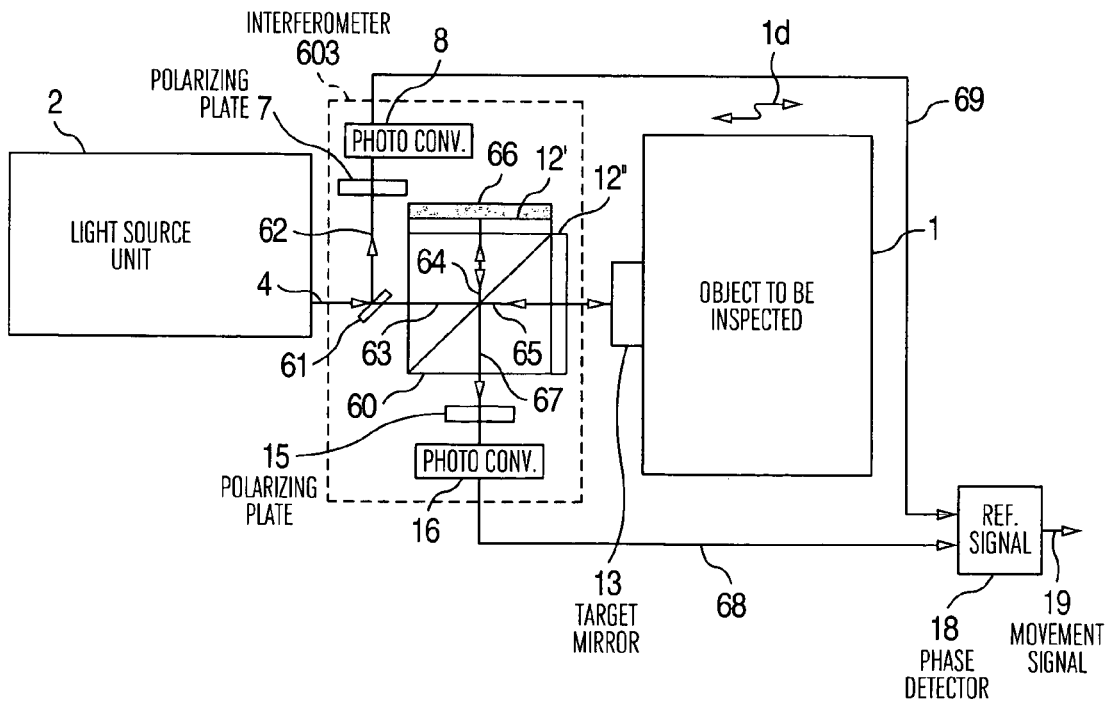
FIG. 6 is a schematic diagram showing an apparatus constitution of the displacement measurement apparatus which generates the reference light by use of a polarization beam splitter and a reflecting mirror in Embodiment 5 of the present invention.

As apparent from FIG. 6, two light beams of the P-polarized light beam 65 and the S-polarized light beam 64 directed toward the target mirror 13 are emitted from the light source unit 2, enter the interferometer unit 603, and pass through the polarization beam splitter 60 only. Even if a temperature or refractive index distribution by a fluctuation of air or the like, or a mechanical vibration is generated, it is supposed that these disturbances equally influence both light beams. When the light beams interfere with each other, the influences of the disturbances are completely offset, the interference light is not easily influenced by any disturbance. The probe light 65 passes through air in the only optical path between the ¼ wavelength plate 12" and the target mirror 13. However, for example, a probe microscope or the like has a stroke of about several hundreds of microns at most. Therefore, a gap between the ¼ wavelength plate 12" and the target mirror 13 can be set to 1 mm or less, and the influence of the disturbance in such micro gap can be ignored. Therefore, according to the present embodiment, in the same manner as in the first embodiment, it is possible to measure a moving velocity V and a movement 1d of a measurement sample 1 stably with a precision of the order of a sub-nanometer to a picometer without controlling environmental factors such as temperature, humidity, and acoustic vibration with a high precision.

Embodiment 6

Next, a sixth embodiment of the present invention will be described with reference to FIG. 7. In the embodiment, probe light reciprocates four times in an optical path between a ¼ wavelength plate and a target mirror. In a displacement measurement apparatus of the present embodiment, since basic constitutions and functions of a light source unit 2 and a phase detection unit 18 are similar to those of the first embodiment, description is omitted. Moreover, in the present embodiment, a light source 2' described in the second embodiment may be used instead of the light source 2.

An interferometer unit 703 only will be described hereinafter. A double-frequency orthogonally polarized light beam 4 or 32 emitted from the light source unit 2 enters the interferometer unit 703, and is reflected by a mirror 71. Thereafter, the light beam is split into two optical paths by a non-polarization beam splitter 70. A double-frequency orthogonally polarized light beam 72 transmitted through the non-polarization beam splitter 70 passes trough a polarizing plate 7 having a polarizing angle in a direction of 45° with respect to both polarization directions as shown by a broken line 7a of FIG. 1C to thereby perform heterodyne interference. This heterodyne interference light is received by a photoelectric conversion element 8, is converted into an electric signal 79 having a beat frequency $f_B$, and is used as a reference signal.

On the other hand, a double-frequency orthogonally polarized light beam 73 reflected by the non-polarization beam splitter 70 enters a reference mirror 11. As shown in FIG. 2, the reference mirror 11 is constituted by forming a diffraction grating by a metal material such as Al on a composite quartz substrate 11b in the same manner as in the first embodiment. A function of the mirror is the same as that of the first embodiment, and the mirror functions as a wire grid polarizer. An S-polarized light beam 10r reflected by the reference mirror 11 passes as reference light through the non-polarization beam splitter 70, and is reflected by reflecting surfaces 70m and 70n. Thereafter, the light beam passes through the non-polarization beam splitter 70 again, is reflected by the reference mirror 11, and is reflected by the non-polarization beam splitter 70.

On the other hand, a P-polarized light beam 10m transmitted through the reference mirror 11 is used as probe light. After passing through a ¼ wavelength plate 12, the P-polarized light beam 10m forms a circularly polarized light beam, is reflected by a target mirror 13, passes again through the ¼ wavelength plate 12 to form an S-polarized light beam, and is reflected by the reference mirror 11. After passing through the ¼ wavelength plate 12, the light beam is reflected as a circularly polarized light beam by the target mirror 13. After passing through the ¼ wavelength plate 12, the light beam forms a P-polarized light beam, and passes through the reference mirror 11.

The P-polarized light beam 10m passes through the same optical path as that of the reference light, passes through the non-polarization beam splitter 70, and is reflected by the reflecting surfaces 70m and 70n. Again the light beam passes through the non-polarization beam splitter 70, again passes through the ¼ wavelength plate 12 to form a circularly polarized light beam, and is reflected by the target mirror 13. After passing through the ¼ wavelength plate 12 again, the light beam forms an S-polarized light beam, and is reflected by the reference mirror 11. After passing through the ¼ wavelength plate 12, the light beam is reflected as a circularly polarized light beam by the target mirror 13. After passing through the ¼ wavelength plate 12, the light beam forms a P-polarized light beam, and passes through the reference mirror 11. That is, the probe light 10m reciprocates four times through the optical path between the reference mirror 11 and the target mirror 13. A movement 1d of a measurement sample 1 is enlarged four times, and is detected.

The P-polarized light beam 10m is combined with the S-polarized light beam 10r as the reference light to form a double-frequency orthogonally polarized light beam 74. After the light beam is reflected by the non-polarization beam splitter 70, the light beam is reflected by the mirror 71. As shown by a broken line 15a of FIG. 1C, the double-frequency orthogonally polarized light beam 74 passes through a polarizing plate 15 having a polarizing angle in a direction of 45° with respect to both polarization directions to thereby perform heterodyne interference. This heterodyne interference light is received by a photoelectric conversion element 16, and is converted into an electric signal 77. Since subsequent operation and signal processing are similar to those of the first embodiment, description is omitted.

Figure 7:
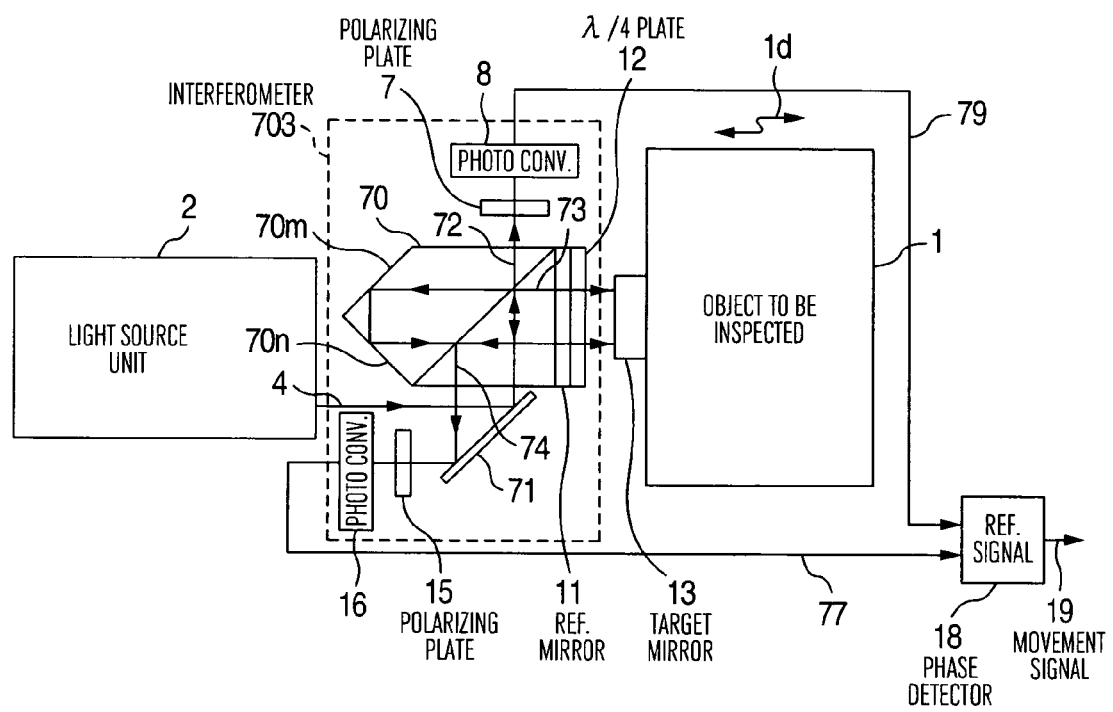
FIG. 7 is a schematic diagram showing an apparatus constitution of the displacement measurement apparatus in which probe light reciprocates four times through an optical path between a ¼ wavelength plate and a target mirror in Embodiment 6 of the present invention.

As apparent from FIG. 7, in the same manner as in the first embodiment, two light beams of the probe light 10m and the reference light 10r directed toward the target mirror 13 are emitted from the light source unit 2, and enter the interferometer unit 703. The light beams pass through completely the same optical path until the light beams reach the reference mirror 11 and further until the light beams from the reference mirror 11 are received by the photoelectric conversion element 16. That is, a common optical path type interferometer is constituted.

Therefore, even if a temperature or refractive index distribution by a fluctuation of air or the like, or a mechanical vibration is generated in the optical path, these disturbances equally influence both of the light beams. When the light beams interfere with each other, the influences of the disturbances are completely offset, and the interference light is not influenced by any disturbance. The probe light 10m only exists in the optical path between the reference mirror 11 and the target mirror 13. However, for example, a probe microscope or the like has a stroke of about several hundreds of microns at most. Therefore, a gap between the reference mirror 11 and the target mirror 13 can be set to 1 mm or less, and the influence of the disturbance in such micro gap can be ignored.

Moreover, in the light source unit 2 shown in FIG. 1B, two polarized light beams 24, 28 crossing each other at right angles pass through separate optical paths, and there is a possibility that the influences of the disturbances are superimposed between both of the optical paths. However, even if there are the influences of the disturbances, the influences equally act on both of the measured heterodyne interference light and reference light. Therefore, when a phase difference is detected between the light in the phase detection unit 18, the influences are offset.

By the constitution of the interferometer of the present embodiment, it is possible to measure a moving velocity V and the movement 1d of the measurement sample 1 stably with a precision of the order of a sub-nanometer to a picometer without controlling environmental factors such as temperature, humidity, and acoustic vibration with a high precision. When a metal diffraction grating (wire grid polarizer) is used as a reference mirror in the present embodiment, in the double-frequency orthogonally polarized light beams, the probe light is generated from one polarized light beam, the reference light can be coaxially generated from the other polarized light beam, and a common optical path type heterodyne interferometer can be constituted. Furthermore, in the present embodiment, the probe light 10m reciprocates four times through the optical path between the reference mirror 11 and the target mirror 13, and the movement 1d of the measurement sample 1 is enlarged four times and is detected. A displacement measurement sensitivity is obtained twice that of the first embodiment.

Embodiment 7

Figure 8A:
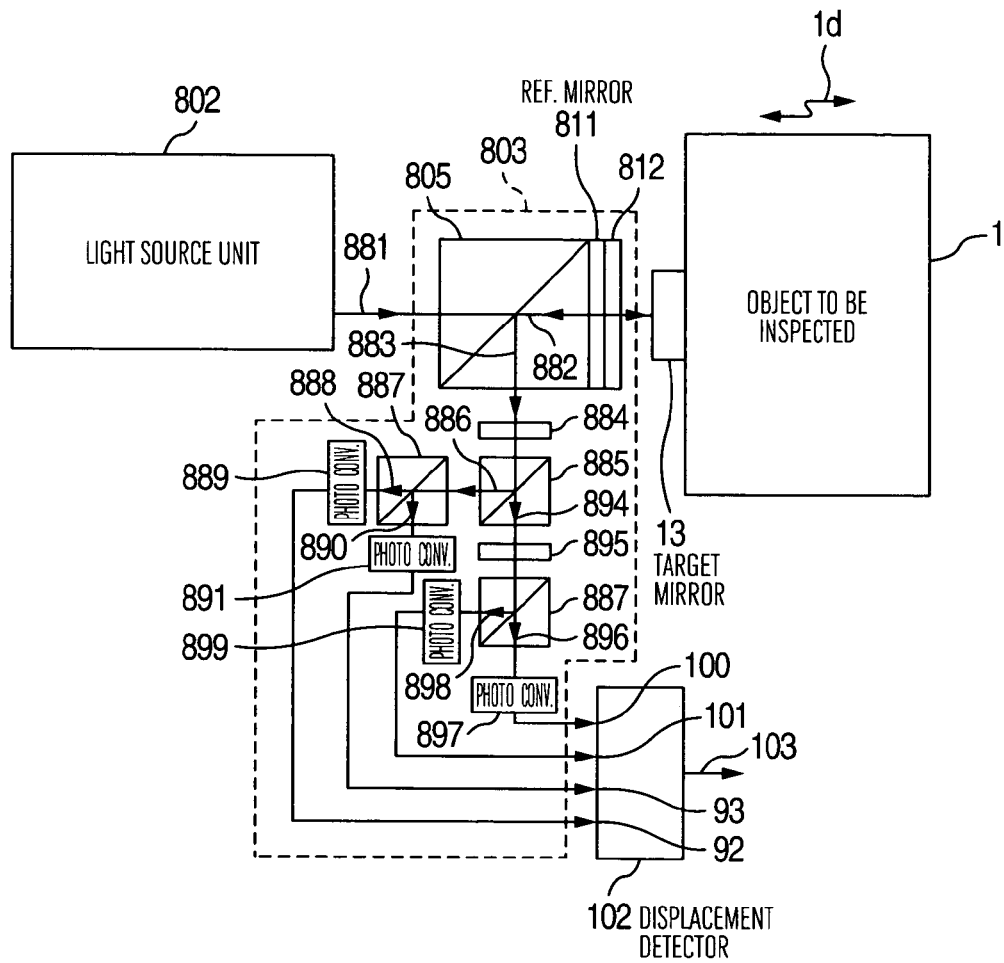
FIG. 8A is a diagram showing a schematic constitution of the displacement measurement apparatus in which a homodyne common optical path interferometer is a basic system in Embodiment 7 of the present invention.
Figure 8B:
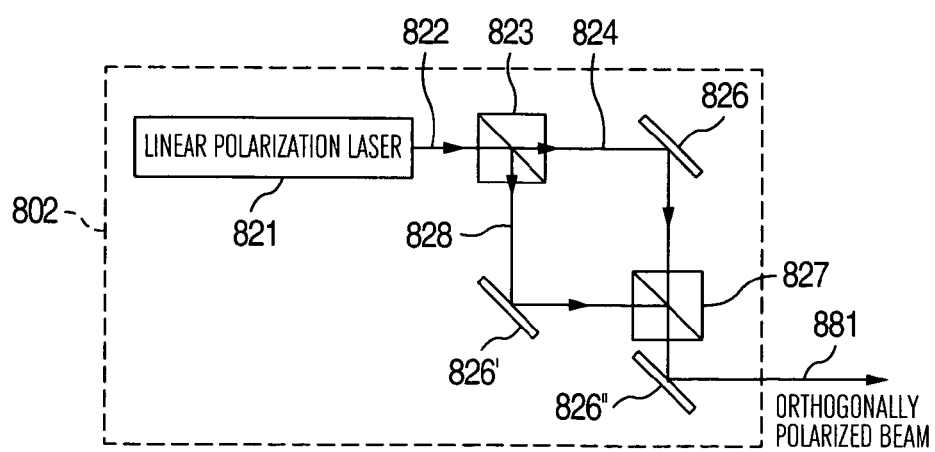
FIG. 8B is a diagram showing a schematic constitution of the light source unit.

In any of the first to sixth embodiments, the heterodyne common optical path type interferometer has been described as a basic system. Next, a seventh embodiment of the present invention will be described with reference to FIG. 8. In the present embodiment, a homodyne common optical path type interferometer is a basic system. As shown in FIG. 8A, in the present embodiment, a displacement measurement apparatus is constituted of a light source unit 802, an interferometer unit 803, and a displacement detection unit 102. As shown in FIG. 8B, in the light source unit 802, an emitted light beam 822 from a linear polarization laser 821 (e.g., frequency stabilized He—Ne laser having a wavelength of 632.8 nm) enters a polarization beam splitter 823 in a polarization direction of 45°, and is split into a P-polarized light beam 824 and an S-polarized light beam 828. The P-polarized light beam 824 passes through the polarization beam splitter 823, and the S-polarized light beam 828 is reflected by the polarization beam splitter 823. After the light beams are reflected by mirrors 826, 826', respectively, the light beams are combined by a polarization beam splitter 827, and are reflected by a mirror 826", and an orthogonally polarized light beam 881 is emitted.

That is, in the present embodiment, unlike the first embodiment, any optical frequency shift is not imparted to the orthogonally polarized light beam. In FIG. 1C, reference numeral 24P denotes a polarization direction of the P-polarized light beam 824 of the double-frequency orthogonally polarized light beam 4, and 28S denotes a polarization direction of the S-polarized light beam 828.

As shown in FIG. 8A, the orthogonally polarized light beam 881 enters the interferometer unit 803. In the interferometer unit 803, an orthogonally polarized light beam 882 transmitted through a non-polarization beam splitter 805 enters a reference mirror 811. As shown in FIG. 2, the reference mirror 811 is constituted by forming a diffraction grating by a metal material such as Al on a composite quartz substrate 11b in the same manner as in the first embodiment, a function of the mirror is the same as that of the first embodiment, and the mirror functions as a wire grid polarizer.

An S-polarized light beam 10r reflected by the reference mirror 811 is used as reference light. A transmitted P-polarized light beam 10m is used as probe light. After passing through a ¼ wavelength plate 812, the P-polarized light beam 10m forms a circularly polarized light beam, and is reflected by a target mirror 13. After passing through the ¼ wavelength plate 812 again, the light beam forms an S-polarized light beam, and is reflected by the reference mirror 811. After passing through the ¼ wavelength plate 812, the light beam is reflected as a circularly polarized light beam by the target mirror 13. After passing through the ¼ wavelength plate 812, the light beam forms a P-polarized light beam, and passes through the reference mirror 811. That is, the probe light 10m reciprocates twice through the optical path between the reference mirror 811 and the target mirror 13, and a movement 1d of a measurement sample 1 is enlarged twice, and detected.

The S-polarized light beam 10r reflected by the reference mirror 811, and the P-polarized light beam 10m transmitted through the mirror are combined, and are reflected as an orthogonally polarized light beam 883 by the non-polarization beam splitter 805. After the orthogonally polarized light beam 883 passes through a ½ wavelength plate 884, a polarization direction of the light beam rotates by 45°, and the light beam is split into two light beams by a non-polarization beam splitter 885. An orthogonally polarized light beam 886 reflected by the non-polarization beam splitter 885 enters a polarization beam splitter 887, and is split into two homodyne interference light beams 888 and 890 whose phases shift from each other by 180°. The homodyne interference light beam 888 is received by a photoelectric conversion element 889 such as a photodiode, and is converted into an electric signal 92. The homodyne interference light beam 890 whose phase has shifted by 180° is received by a photoelectric conversion element 891, and is converted into an electric signal 93.

An orthogonally polarized light beam 894 transmitted through the non-polarization beam splitter 885 passes through a ¼ wavelength plate 895. Thereafter, a phase difference of ±90° is added, and the light beam enters the polarization beam splitter 887, and is further split into two homodyne interference light beams 896 and 898 whose phases shift from each other by 180°. The homodyne interference light beam 896 is received by a photoelectric conversion element 897 such as a photodiode, and is converted into an electric signal 199. The homodyne interference light beam 898 whose phase has shifted by 180° is received by a photoelectric conversion element 899, and is converted into an electric signal 101.

Four homodyne interference signals 92, 93, 100, 101 are given by Equation 3 to Equation 6, respectively.

$$I_1 = I_m + I_r + 2(I_m \cdot I_r)^{1/2}\cos(4\pi nD/\lambda); \quad (3)$$

$$I_2 = I_m + I_r + 2(I_m \cdot I_r)^{1/2}\cos(4\pi nD/\lambda + \pi); \quad (4)$$
$$= I_m + I_r - 2(I_m \cdot I_r)^{1/2}\cos(4\pi nD/\lambda)$$

$$I_3 = I_m + I_r + 2(I_m \cdot I_r)^{1/2}\cos(4\pi nD/\lambda + \pi/2); \text{ and} \quad (5)$$
$$= I_m + I_r - 2(I_m \cdot I_r)^{1/2}\sin(4\pi nD/\lambda)$$

$$I_4 = I_m + I_r + 2(I_m \cdot I_r)^{1/2}\cos(4\pi nD/\lambda + 3\pi/2), \quad (6)$$
$$= I_m + I_r - 2(I_m \cdot I_r)^{1/2}\sin(4\pi nD/\lambda)$$

where, $I_m$ denotes a detected intensity of the probe light, $I_r$ denotes a detected intensity of the reference light, n denotes a refractive index of the air, D denotes the movement 1*d* of the measurement sample 1, and λ denotes a wavelength of the laser light 822. In the displacement detection unit 102, the movement D of the measurement sample 1 is calculated from Equation 3 to Equation 6 based on Equation 7, and a movement signal 103 is output.

$$D=(\lambda/4\pi n)\tan^{-1}\{(I_4-I_3)/(I_1-I_2)\} \quad (7)$$

As apparent from FIG. 8A, two light beams of the probe light 10*m* and the reference light 10*r* directed toward the target mirror 13 are emitted from the light source unit 802, and enter the interferometer unit 803. The light beams pass through completely the same optical path until the light beams reach the reference mirror 811 and further until the light beams from the reference mirror 811 are received by the photoelectric conversion elements 889, 891, 897, 899. That is, a common optical path type interferometer is constituted.

Thereafter, even if a temperature or refractive index distribution by a fluctuation of air or the like, or a mechanical vibration is generated in the optical path, these disturbances equally influence both of the light beams. Therefore, when the light beams interfere with each other, the influences of the disturbances are completely offset, and the interference light is not influenced by any disturbance. The probe light 10*m* only exists in the optical path between the reference mirror 811 and the target mirror 13. However, for example, a probe microscope or the like has a stroke of about several hundreds of microns at most. Therefore, a gap between the reference mirror 811 and the target mirror 13 can be set to 1 mm or less, and the influence of the disturbance in such micro gap can be ignored. In the light source unit 802 shown in FIG. 8B, two polarized light beams 824, 828 crossing each other at right angles pass through separate optical paths, and there is a possibility that the influences of the disturbances are superimposed between both of the optical paths. However, even if there are the influences of the disturbances, the influences equally act on four measured homodyne interference light beams, and are offset in a process of Equation 7 in the displacement detection unit 102.

By the constitution of the interferometer of the present embodiment, it is possible to measure a moving velocity V and the movement 1*d* of the measurement sample 1 stably with a precision of the order of a sub-nanometer to a picometer without controlling environmental factors such as temperature, humidity, and acoustic vibration with a high precision. When a metal diffraction grating (wire grid polarizer) is used as a reference mirror in the present embodiment, in the orthogonally polarized light beams, the probe light is generated from one polarized light beam, the reference light can be coaxially generated from the other polarized light beam, and a common optical path type homodyne interferometer can be constituted.

Embodiment 8

Next, an eighth embodiment of the present invention will be described with reference to FIG. 9. In the embodiment, a homodyne interferometer is a basic system in the same manner as in the seventh embodiment. A displacement measurement apparatus of the present embodiment is constituted of a light source unit 802, an interferometer unit 903, and a displacement detection unit 102 in the same manner as in the seventh embodiment. Since constitutions and functions of the light source unit 802 and the displacement detection unit 102 are the same as those of the seventh embodiment, description is omitted. An orthogonally polarized light beam 881 emitted from the light source unit 802 enters the interferometer unit 903. In the interferometer unit 903, an orthogonally polarized light beam 982 transmitted through a non-polarization beam splitter 905 enters a reference mirror 911. As shown in FIG. 2, the reference mirror 911 is constituted by forming a diffraction grating by a metal material such as Al on a composite quartz substrate 11*b* in the same manner as in the reference mirror 11 of the first embodiment, a function of the mirror is the same as that of the first embodiment, and the mirror functions as a wire grid polarizer. An S-polarized light beam 10*r* reflected by the reference mirror 911 is used as reference light.

A transmitted P-polarized light beam 10*m* is used as probe light. After passing through a ¼ wavelength plate 912, the P-polarized light beam 10*m* forms a circularly polarized light beam, and is reflected by a target mirror 13. After passing through the ¼ wavelength plate 912 again, the light beam forms an S-polarized light beam, and is reflected by the reference mirror 911. After passing through the ¼ wavelength plate 912, the light beam is reflected as a circularly polarized light beam by the target mirror 13. After passing through the ¼ wavelength plate 912, the light beam forms a P-polarized light beam, and passes through the reference mirror 911. That is, the probe light 10*m* reciprocates twice through the optical path between the reference mirror 911 and the target mirror 13, and a movement 1d of a measurement sample 1 is enlarged twice, and detected. The S-polarized light beam 10r reflected by the reference mirror 911 is combined with the transmitted P-polarized light beam 10m, and is reflected as an orthogonally polarized light beam 983 by the non-polarization beam splitter 905. The orthogonally polarized light beam 983 is enlarged by a light beam expander 201.

This enlarged light beam 202 is divided into four orthogonally polarized light beams 204, 205, 206, 207 by a diffractive optical element (DOE) 203, and the light beams enter a phase shift mask 208 made of a birefringent material. This phase shift mask 208 is divided into four regions 208a, 208b, 208c, 208d corresponding to four orthogonally polarized light beams 204 to 207 to impart phase shifts of 0°, 90°, 180°, 270° between polarized light beams passing through each region and crossing each other at right angles. Four orthogonally polarized light beams provided with the phase shifts pass through a polarizing plate 209 having a polarizing angle in a direction of 45° with respect to both polarization directions to perform homodyne interference.

Four homodyne interference light beams 210 to 213 are received by a photoelectric conversion element 214, and are converted into electric signals 215 to 218. Four homodyne interference signals 215 to 218 are given by Equation 3 to Equation 6, respectively, in the same manner as in the seventh embodiment. In the displacement detection unit 102, a movement D of the measurement sample 1 is calculated from Equation 3 to Equation 6 based on Equation 7, and a movement signal 103 is output.

Figure 9:
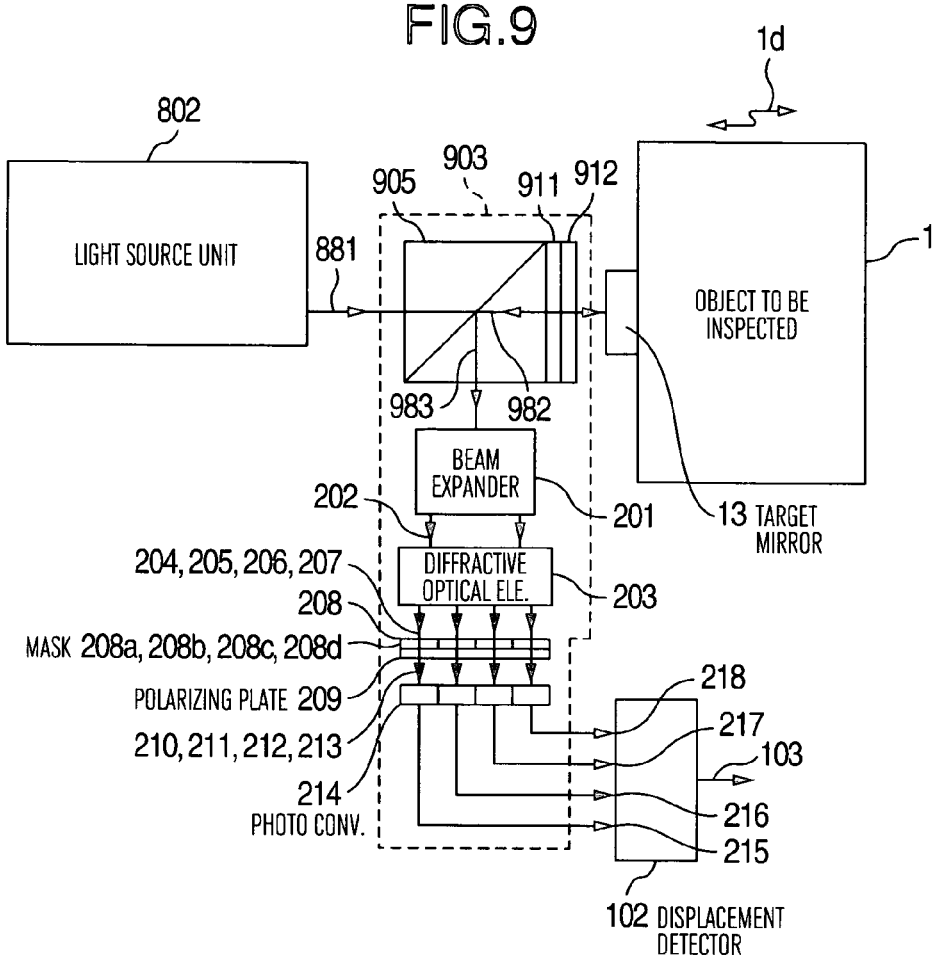
FIG. 9 is a schematic diagram showing an apparatus constitution of the displacement measurement apparatus in which the homodyne common optical path interferometer is a basic system in Embodiment 8 of the present invention.
Figure 10:
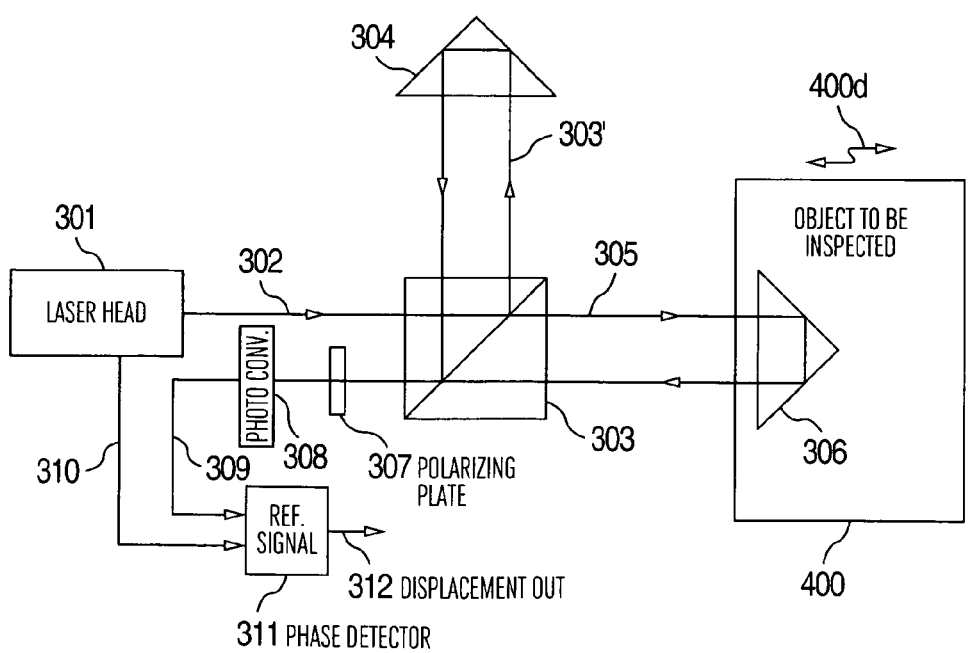
FIG. 10 is an explanatory view of the displacement measurement apparatus using conventional light interference.

As apparent from FIG. 9, two light beams of the probe light 10m and the reference light 10r directed toward the target mirror 13 are emitted from the light source unit 902, and enter the interferometer unit 903. The light beams pass through completely the same optical path until the light beams reach the reference mirror 911 and further until the light beams from the reference mirror 911 are received by the photoelectric conversion element 214. That is, a common optical path type interferometer is constituted. Therefore, even if a temperature or refractive index distribution by a fluctuation of air or the like, or a mechanical vibration is generated in the optical path, these disturbances equally influence both of the light beams. Therefore, when the light beams interfere with each other, the influences of the disturbances are completely offset, and the interference light is not influenced by any disturbance. The probe light 10m only exists in the optical path between the reference mirror 911 and the target mirror 13. However, for example, a probe microscope or the like has a stroke of about several hundreds of microns at most. Therefore, a gap between the reference mirror 911 and the target mirror 13 can be set to 1 mm or less, and the influence of the disturbance in such micro gap can be ignored.

By the constitution of the interferometer of the present embodiment, it is possible to measure a moving velocity V and the movement 1d of the measurement sample 1 stably with a precision of the order of a sub-nanometer to a picometer without controlling environmental factors such as temperature, humidity, and acoustic vibration with a high precision. When a metal diffraction grating (wire grid polarizer) is used as a reference mirror in the present embodiment, in the orthogonally polarized light beams, the probe light is generated from one polarized light beam, the reference light can be coaxially generated from the other polarized light beam, and a common optical path type homodyne interferometer can be constituted. In the present embodiment, the DOE 203, and the flat phase shift mask 208 are used in generating four interference light beams whose phases have been shifted. Therefore, there are advantages that the constitution of the interferometer unit 903 is simplified, stability increases, and dimensions are reduced. Therefore, the apparatus is applicable even to a case where there is not any space around the measurement sample 1.

The embodiments of the present invention have been described above in accordance with the example where the movement 1d of the measurement sample 1 is measured. Examples of the measurement sample 1 include a stage or the like of a semiconductor exposure device, an inspection device or the like, a stage on which a probe of a probe microscope or a measurement sample is mounted, and a working tool (turning tool, etc.). Furthermore, the present invention is not limited to these embodiments. For example, the target mirror 13 is removed, the surface of the sample 1 is directly irradiated with the probe light 10m, and measurement is performed while moving the sample 1 in a direction crossing the probe light 10m at right angles. In this case, it is possible to measure micro irregularities of the sample 1 surface with a resolution of a sub-nanometer to a picometer with a good precision. Examples of a sample in this case include surface roughness of a magnetic disc surface or a magnetic head float-up surface, components of micro-electro-mechanical systems (MEMS) such as micro lenses and the like. When a condensing lens is inserted between the reference mirror 11 and the sample 1, an in-plane spatial resolution also reaches the order of a sub-micron.

Moreover, it is obvious that the third embodiment of the present invention can be combined with the fourth to eighth embodiments.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

The invention claimed is:

1. A method of measuring a displacement of a sample to be inspected, comprising:

splitting a light beam emitted from a light source into a first light beam and a second light beam;

detecting the first light beam with a first sensor;

irradiating a reference mirror having a diffraction grating for reflecting a first polarization state light beam and passing a second polarization state light beam with light having the first polarization state among the split second light beam, and reflecting the light having a first polarization state by the reference mirror;

irradiating a sample with light having the second polarization state among the split second light beam, and reflecting the light having the second polarization state by the sample;

generating an interference light by overlapping light reflected by the reference mirror with light reflected from the sample, and passing the overlapped lights through a polarizing plate;

detecting the interference light with a second sensor; and extracting displacement information of the sample by processing a signal output from the first sensor corresponding to the first light beam and a signal output from the second sensor corresponding to the interference light.

2. The method of measuring the displacement according to claim 1, wherein the step of irradiating the reference mirror further includes a step of reflecting the light having a first polarization state such that its optical axis and an optical axis of the light having a second polarization state deviate from each other partially or entirely in a same medium.

3. The method of measuring the displacement according to claim 1, wherein the step of irradiating the reference mirror further includes a step of reflecting the light having a first polarization state such that its optical axis and an optical axis of the light having a second polarization state are coaxial.

4. A method of measuring a displacement of a sample to be inspected, comprising the steps:
   splitting a light beam emitted from a light source into first polarized light beam and a second polarized light beam;
   irradiating the sample with the second polarized light beam;
   irradiating with the first polarized light beam a reference surface disposed on an optical axis of the first polarized light beam, and allowing a reflected light beam from the sample by the irradiation with the second polarized light beam to interfere with a reflected light beam from the reference surface by the irradiation with the first polarized light beam to generate interference light; and
   extracting displacement information of the sample from information included in the interference light;
   wherein the step of irradiating a reference surface comprises a step of irradiating a reference surface having a diffraction grating for reflecting the first polarized light and passing the second polarized light.

5. An apparatus for measuring a displacement of a sample to be inspected, comprising:
   a light source for emitting a laser beam;
   a beam splitter for splitting a light beam emitted from the light source into a first light beam and second light beam;
   a first sensor for detecting the first light beam;
   a reference mirror having a diffraction grating for reflecting a first polarization state light beam and passing a second polarization state light beam for reflecting light having a first polarization state in the split second light beam;
   a reflector installed on a sample for reflecting light having a second polarization state in the split second light beam which is not reflected by the reference mirror;
   an interference light generator for generating an interference light by overlapping light reflected by the reference mirror with light reflected by the reflector installed on the sample, and passing the overlapped lights through a polarizing plate;
   a second sensor for detecting the interference light generated by the interference light generator; and
   a processor for processing a signal output from the first sensor corresponding to the first light beam and a signal output from the second sensor corresponding to the interference light, and extracting displacement information of the sample.

6. The apparatus for measuring the displacement according to claim 5, wherein an optical axis of the light having a first polarization state and an optical axis of the light having a second polarization state deviate from each other partially or entirely in a same medium.

7. The apparatus for measuring the displacement according to claim 5, wherein an optical axis of the light having a first polarization state and an optical axis of the light having a second polarization state are coaxial.

8. An apparatus for measuring displacement of an object to be inspected, comprising:
   a light source;
   splitting means for splitting a light beam emitted from the light source into a first polarized light beam and a second polarized light beam;
   irradiating means for irradiating the sample with the second polarized light beam split by the splitting means, and irradiating a reference surface with the first polarized light beam;
   interfering means for allowing a reflected light beam from the sample irradiated with the second polarized light beam by the irradiating means to interfere with the reflected light beam from the reference surface irradiated with the second polarized light beam by the irradiating means to generate interference light; and
   displacement information extracting means for detecting the interference light generated by the interfering means to obtain displacement information of the sample;
   wherein the reference surface further comprises a diffraction grating for reflecting the first polarized light beam and passing the second polarized light beam.

9. The apparatus for measuring displacement according to claim 5, wherein the reflector includes a dielectric multilayered film.

* * * * *